(12) United States Patent
Priewasser

(10) Patent No.: US 9,768,049 B2
(45) Date of Patent: Sep. 19, 2017

(54) SUPPORT PLATE AND METHOD FOR FORMING SUPPORT PLATE

(71) Applicant: DISCO CORPORATION, Tokyo (JP)

(72) Inventor: Karl Heinz Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/335,247

(22) Filed: Oct. 26, 2016

(65) Prior Publication Data

US 2017/0047241 A1 Feb. 16, 2017

Related U.S. Application Data

(62) Division of application No. 14/713,670, filed on May 15, 2015.

(30) Foreign Application Priority Data

May 16, 2014 (JP) ................... 2014-101964

(51) Int. Cl.
*H01L 21/00* (2006.01)
*H01L 21/683* (2006.01)
*H01L 21/78* (2006.01)
*H01L 21/304* (2006.01)
*H01L 21/67* (2006.01)
(Continued)

(52) U.S. Cl.
CPC ........ *H01L 21/6835* (2013.01); *H01L 21/268* (2013.01); *H01L 21/304* (2013.01); *H01L 21/67092* (2013.01); *H01L 21/67346* (2013.01); *H01L 21/78* (2013.01); *H01L 2221/6834* (2013.01); *H01L 2221/68327* (2013.01); *H01L 2221/68381* (2013.01); *Y10T 29/49865* (2015.01)

(58) Field of Classification Search
CPC ............... H01L 23/367; H01L 21/4846; H01L 21/4871; H01L 21/56; H01L 21/561; H01L 23/36; H01L 23/5389; H01L 24/97; H01L 33/507; H01L 33/52; H01L 33/62; H01L 33/64; H01L 23/49575
USPC ........................................................ 438/464
See application file for complete search history.

(56) References Cited

U.S. PATENT DOCUMENTS

| | | |
|---|---|---|
| 4,669,228 A | 6/1987 | Rogers |
| 2010/0267219 A1 | 10/2010 | Kajiyama |
| 2013/0230966 A1 | 9/2013 | Martin et al. |

FOREIGN PATENT DOCUMENTS

| | | |
|---|---|---|
| JP | 5-198542 | 8/1993 |
| JP | 2004-207606 | 7/2004 |

*Primary Examiner* — Xinning Niu
*Assistant Examiner* — Vu A Vu
(74) *Attorney, Agent, or Firm* — Greer Burns & Crain, Ltd.

(57) ABSTRACT

A method for processing a wafer having a device region and a peripheral surplus region surrounding the device region on a front surface thereof. The method includes: preparing a support plate including a base plate in which a recess is formed in a front surface region corresponding to the device region and an annular groove is formed in a region corresponding to the peripheral surplus region and a soft member is packed in the recess of the base plate; injecting an adhesive into the annular groove of the support plate; sticking the wafer onto the support plate with the adhesive such that the device region abuts against the soft member; holding the wafer with intermediary of the support plate and performing processing on the wafer; and making a cutting blade cut into a region corresponding to the annular groove of the support plate to remove the adhesive.

16 Claims, 10 Drawing Sheets

(51) Int. Cl.
*H01L 21/673* (2006.01)
*H01L 21/268* (2006.01)

SUPPORT PLATE AND METHOD FOR FORMING SUPPORT PLATE

This application is a divisional of application Ser. No. 14/713,670, filed May 15, 2015.

BACKGROUND OF THE INVENTION

Field of the Invention

The present invention relates to a support plate that supports a wafer, a method for forming a support plate, and a method for processing a wafer by using a support plate.

Description of the Related Art

A semiconductor wafer on which a large number of devices such as ICs and LSIs are formed on the front surface and the individual devices are marked out by plural planned dividing lines (streets) formed into a lattice manner is processed into a predetermined thickness through grinding of the back surface by grinding apparatus. Then, the planned dividing lines are cut by cutting apparatus (dicing saw) and the semiconductor wafer is divided into the individual devices. The devices obtained by the dividing are widely utilized for various kinds of electronic apparatus such as mobile phones and personal computers.

The grinding apparatus that grinds the back surface of the wafer has a chuck table that holds the wafer and a grinding unit on which a grinding wheel having a grinding abrasive to grind the wafer held by this chuck table is rotatably mounted. The grinding apparatus can grind the wafer into a desired thickness with high accuracy. To grind the back surface of the wafer, the front surface side on which the large number of devices are formed needs to be held by suction by the chuck table. Therefore, normally a protective tape is stuck to the front surface of the wafer in order to prevent the wafer from being scratched (refer to e.g. Japanese Patent Laid-Open No. Hei 5-198542).

In recent years, electronic apparatus has a tendency toward smaller size and smaller thickness and semiconductor devices incorporated therein are also required to have smaller size and smaller thickness. However, when the back surface of a wafer is ground to reduce the thickness of the wafer to e.g. 100 μm or smaller, and furthermore to 50 μm or smaller, the rigidity significantly decreases and thus subsequent handling becomes very difficult. Moreover, warpage is caused in the wafer depending on the case and there is also a possibility that the wafer itself breaks due to the warpage. To solve such a problem, a wafer support system (WSS) is employed. In the WSS, the front surface side of a wafer is stuck to a rigid protective member by using an adhesive in advance and then the back surface of the wafer is ground to reduce the thickness of the wafer to a predetermined thickness (refer to e.g. Japanese Patent Laid-Open No. 2004-207606).

SUMMARY OF THE INVENTION

However, it is difficult to remove the wafer from the protective tape or the protective member of the WSS without a breakage. In particular, in recent years, there is a tendency toward larger wafer diameter and smaller finished thickness and therefore it is difficult to remove the wafer from the protective member without a breakage. Furthermore, there is also a problem that a glue or adhesive remains on the surfaces of the devices after the wafer is removed from the protective member.

Therefore, an object of the present invention is to provide a support plate that allows easy removal of a wafer therefrom and is free from the remaining of a glue or adhesive on the surfaces of devices.

In accordance with an aspect of the present invention, there is provided a support plate to which a front surface of a wafer having a device region in which a plurality of devices are formed and a peripheral surplus region surrounding the device region on the front surface is stuck, the support plate comprising: a base plate in which a recess is formed in a front surface region corresponding to the device region of the wafer to be stuck to the support plate and an annular groove is formed in a region corresponding to the peripheral surplus region of the wafer; and a soft member packed in the recess of the base plate, wherein the wafer is adapted to be stuck to a front surface of the support plate with intermediary of an adhesive by injecting the adhesive into the annular groove.

In accordance with another aspect of the present invention, there is provided a method for forming a support plate to which a front surface of a wafer having a device region in which a plurality of devices are formed and a peripheral surplus region surrounding the device region on the front surface is stuck. The support plate has a recess corresponding to the device region of the wafer and a soft member is packed in the recess. The method includes a recess forming step of forming the recess by grinding a front surface region of a base plate corresponding to the device region of the wafer to be stuck to the support plate, an annular groove forming step of forming, by a cutting blade, an annular groove in a region of the base plate corresponding to the peripheral surplus region of the wafer to be stuck to the support plate before or after carrying out the recess forming step, and a soft member packing step of packing the soft member into the recess at least after carrying out the recess forming step.

In accordance with a still another aspect of the present invention, there is provided a method for processing a wafer having a device region in which a plurality of devices are formed and a peripheral surplus region surrounding the device region on a front surface thereof. The method includes a support plate preparing step of preparing a support plate including a base plate in which a recess is formed in a front surface region corresponding to the device region of the wafer to be stuck to the support plate and an annular groove is formed in a region corresponding to the peripheral surplus region of the wafer and a soft member packed in the recess of the base plate, and an adhesive injecting step of injecting an adhesive into the annular groove of the support plate. The method further includes a sticking step of sticking the wafer onto the support plate with the intermediary of the adhesive in such a manner that the device region of the wafer abuts against the soft member after carrying out the adhesive injecting step, a processing step of holding the wafer with the intermediary of the support plate and performing processing on the wafer after carrying out the sticking step, and an adhesive removing step of making a cutting blade cut into a region corresponding to the annular groove of the support plate and removing the adhesive after carrying out the processing step.

To the support plate of the present invention, only the peripheral surplus region of the wafer is stuck with the intermediary of the adhesive injected into the annular groove. Therefore, a glue or adhesive does not remain on the front surfaces of the devices. Because the wafer is stuck to the support plate by a slight amount of adhesive disposed at the periphery of the wafer, the removal of the wafer from the support plate is easy. Furthermore, when the peripheral part of the wafer is stuck to the support plate with the intermediary of the adhesive, the device region of the wafer abuts against the soft member of the support plate and therefore the devices are prevented from being scratched.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
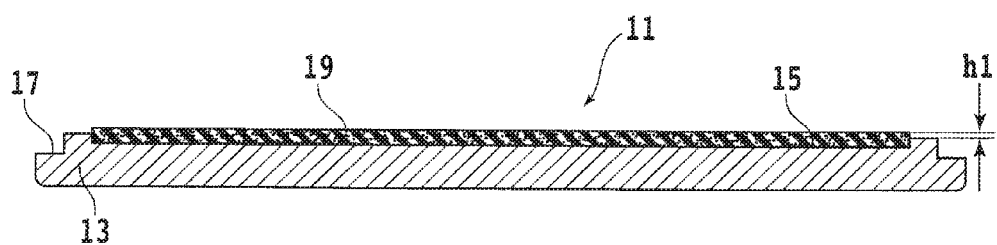
FIG. 1A is a sectional view of a support plate of a first embodiment.

Embodiments of the present invention will be described in detail below with reference to the drawings. FIG. 1A is a sectional view of a support plate 11 of a first embodiment of the present invention. The support plate 11 has a base plate 13 in which a recess 15 is formed in a front surface region corresponding to a device region 31 of a wafer 25 (see FIG. 6) to be stuck to the support plate 11 and an annular groove 17 is formed in a region corresponding to a peripheral surplus region 33 of the wafer 25. The support plate 11 further has a soft member 19 packed into the recess 15 of the base plate 13.

The base plate 13 is formed of a silicon wafer, a glass wafer, or the like. The upper surface and one side surface of the annular groove 17 are opened. The soft member 19 is formed of e.g. sponge rubber or rubber. If the soft member 19 has flatness, it is preferable that a surface of the soft member 19 be flush with a surface of the base plate 13. However, if the surface of the soft member 19 packed in the recess 15 of the base plate 13 does not have so high flatness and a planarization step of planarizing the surface of the soft member 19 is carried out, it is preferable to form the soft member 19 with a height higher than the surface of the base plate 13 by h1. h1 is e.g. about 2 μm to 20 μm.

Figure 1B:
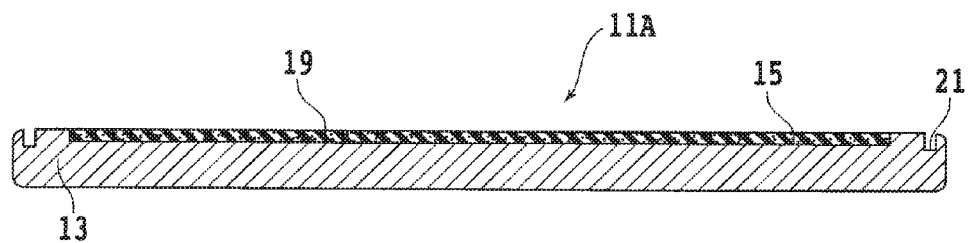
FIG. 1B is a sectional view of a support plate of a second embodiment.

FIG. 1B is a sectional view of a support plate 11A of a second embodiment. In the present embodiment, an annular groove opened only upward is employed as an annular groove 21 formed in a region corresponding to the peripheral surplus region 33 of the wafer 25. It is preferable that the surface of the soft member 19 packed in the recess 15 of the base plate 13 be flush with the front surface of the base plate 13. However, in the case of carrying out the planarization step as described above, the soft member 19 is so formed that its surface is higher than the front surface of the base plate 13 by 2 μm to 20 μm.

Figure 2:
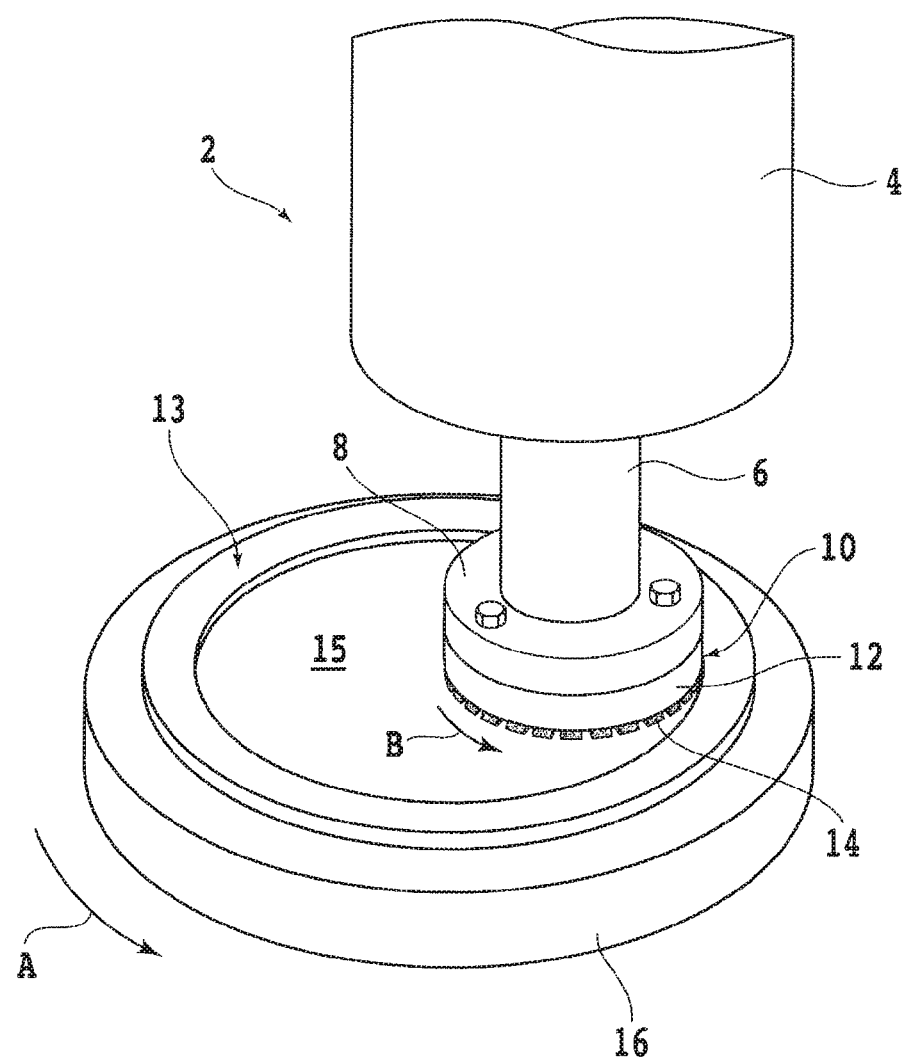
FIG. 2 is a perspective view showing a recess forming step.

Next, a recess forming step will be described with reference to FIG. 2. In FIG. 2, numeral 2 denotes a grinding unit of grinding apparatus. The grinding unit includes a spindle 6 rotatably housed in a spindle housing 4, a wheel mount 8 fixed to the tip of the spindle 6, and a grinding wheel 10 attachably/detachably mounted on the wheel mount 8. The grinding wheel 10 is composed of an annular wheel base 12 and plural grinding abrasives 14 stuck to the peripheral part of the lower end of the wheel base 12 in an annular manner.

In the recess forming step, the base plate 13 is held by suction by a chuck table 16 of the grinding apparatus and the grinding wheel 10 is rotated in a direction indicated by an arrow B at e.g. 6000 rpm while the chuck table 16 is rotated in a direction indicated by an arrow A at e.g. 300 rpm. In addition, a grinding unit feed mechanism (not shown) is driven to bring the grinding abrasives 14 into contact with the base plate 13. Then, grinding feed of the grinding wheel 10 is performed downward by a predetermined amount at a predetermined grinding feed rate. As a result, in the base plate 13, the region corresponding to the device region 31 of the wafer 25 is removed by the grinding and the recess 15 having a circular shape is formed. In addition, the region corresponding to the peripheral surplus region 33 of the wafer 25 is left.

Figure 3:
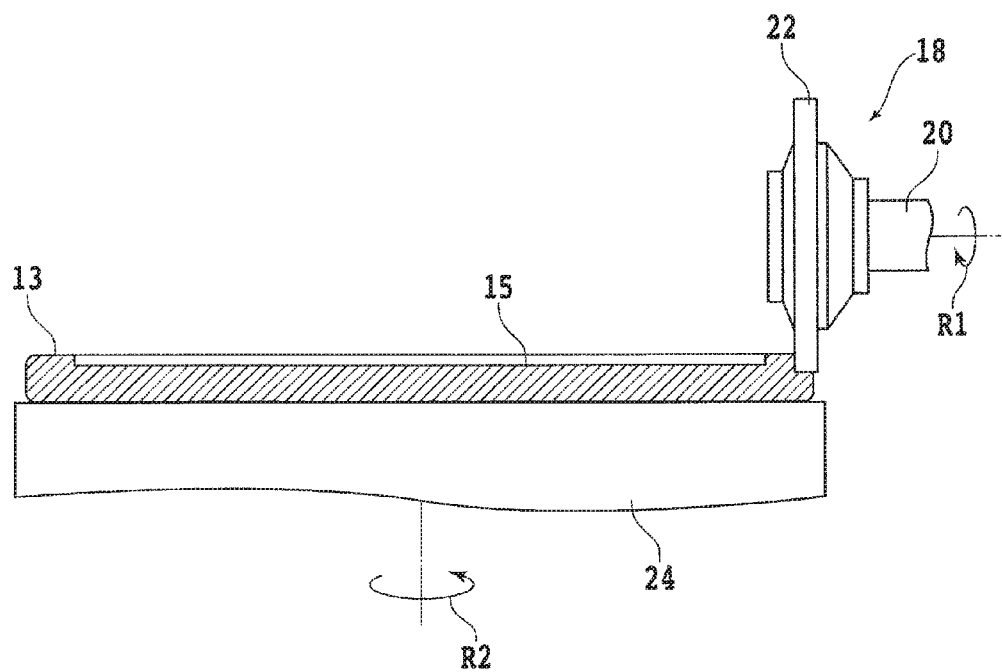
FIG. 3 is a partially sectional side view showing an annular groove forming step.

After or before the recess forming step is carried out, an annular groove forming step of forming, by a cutting blade, an annular groove in the region of the base plate 13 corresponding to the peripheral surplus region 33 of the wafer 25 to be stuck to the support plate 11 is carried out. As shown in FIG. 3, the annular groove forming step is carried out by a cutting unit 18 of cutting apparatus. The cutting unit 18 includes a spindle 20 that is rotationally driven and a cutting blade 22 mounted at the tip part of the spindle 20. Preferably, the cutting blade 22 is a washer blade, the whole circumference of which is formed of a cutting edge.

Figure 4:
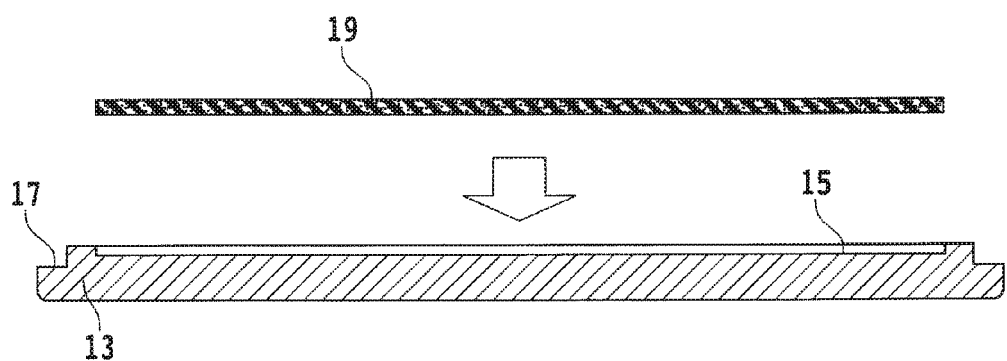
FIG. 4 is a sectional view showing a soft member packing step.

In the annular groove forming step, the base plate 13 in which the recess 15 is formed is held by suction by a chuck table 24 of the cutting apparatus. Then, the cutting blade 22 that rotates at a high speed in a direction of an arrow R1 is made to cut into the peripheral part of the base plate 13 by a predetermined depth and the chuck table 24 is rotated at a low speed in a direction of an arrow R2. Therefore, as shown in FIG. 4 the annular groove 17 whose upper surface and one side surface are opened is formed at the peripheral part of the base plate 13. This annular groove 17 may be formed by a grinding wheel instead of the cutting blade 22.

At least after the recess forming step is carried out, a soft member packing step of packing the soft member 19 into the recess 15 of the base plate 13 is carried out as shown in FIG. 4. As the soft member 19, e.g. a member that has high tight-contact performance and tack force with respect to a wafer but does not have adhesiveness is preferable. For example, an elastic member such as rubber or sponge rubber can be employed. After the soft member 19 is packed into the recess 15 of the base plate 13, the front surface of the soft member 19 may be cut to be planarized by e.g. a single point cutting tool. In this case, the front surface of the soft member 19 is so set as to be higher than the front surface of the base plate 13 by h1 as shown in FIG. 1A.

Figure 5:
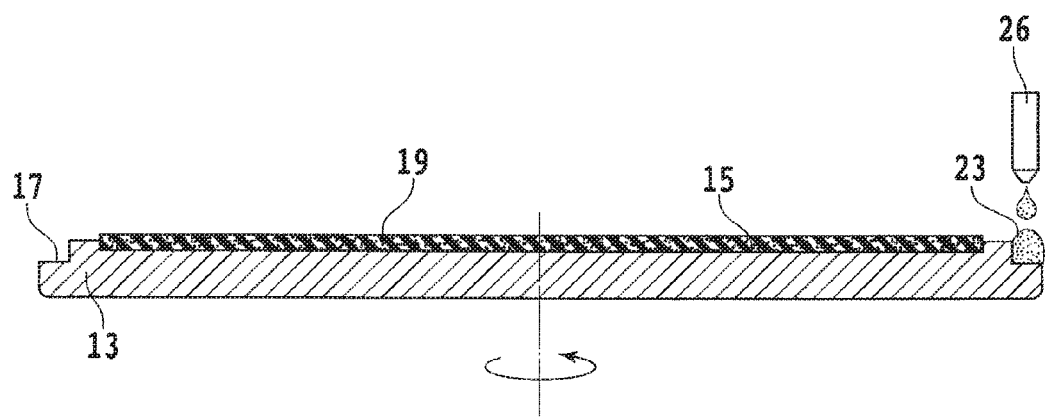
FIG. 5 is a sectional view showing an adhesive injecting step.

Next, a method for processing a wafer by using the support plate 11 shown in FIG. 1A will be described with reference to FIGS. 5 to 10. First, an adhesive injecting step of injecting an adhesive 23 into the annular groove 17 of the support plate 11 is carried out. In this adhesive injecting step, as shown in FIG. 5, the support plate 11 is held by suction by a chuck table (not shown). Then, the adhesive 23 is supplied from an adhesive supply nozzle 26 to the annular groove 17 while the support plate 11 is slowly rotated, and the adhesive 23 is injected into the whole circumference of the annular groove 17. The adhesive 23 may be continuously injected into the whole circumference of the annular groove 17 or may be discontinuously injected. Moreover, a sheet-shaped adhesive formed into a size corresponding to the annular groove in advance may be disposed on the annular groove.

Figure 6:
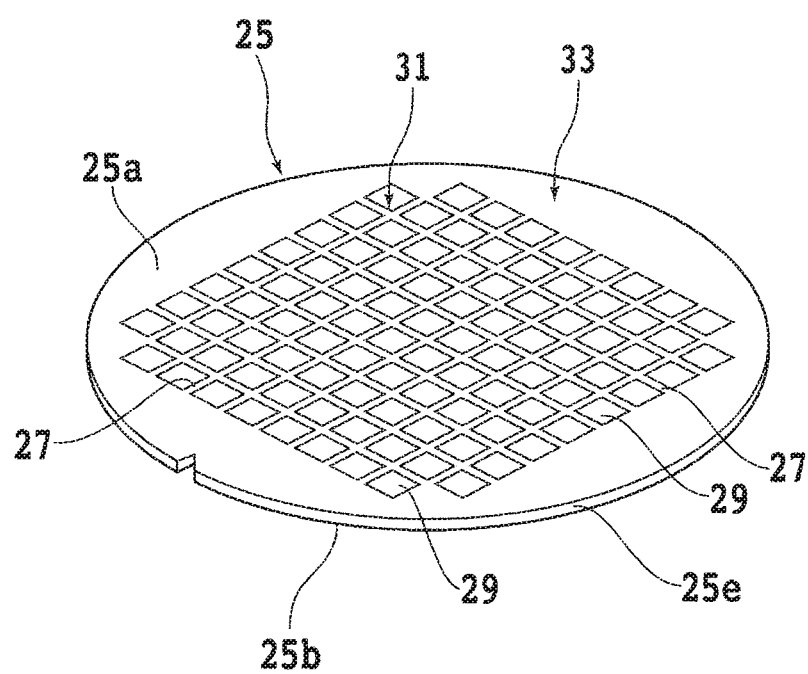
FIG. 6 is a perspective view of a semiconductor wafer.

Next, the semiconductor wafer (hereinafter, often abbreviated simply as the wafer) 25 to be stuck onto the support plate 11 will be described with reference to FIG. 6. The semiconductor wafer 25 is formed of e.g. a silicon wafer having a thickness of 700 μm and plural street (planned dividing lines) 27 are formed on a front surface 25a in a lattice manner. In addition, devices 29 such as ICs and LSIs are formed in the respective regions marked out by the plural streets 27. The wafer 25 configured in this manner has, on its front surface 25a, the device region 31 in which the devices 29 are formed and the peripheral surplus region 33 surrounding the device region 31. Furthermore, a chamfered part 25e having a circular arc shape is formed at the outer circumference of the wafer 25.

Figure 7:
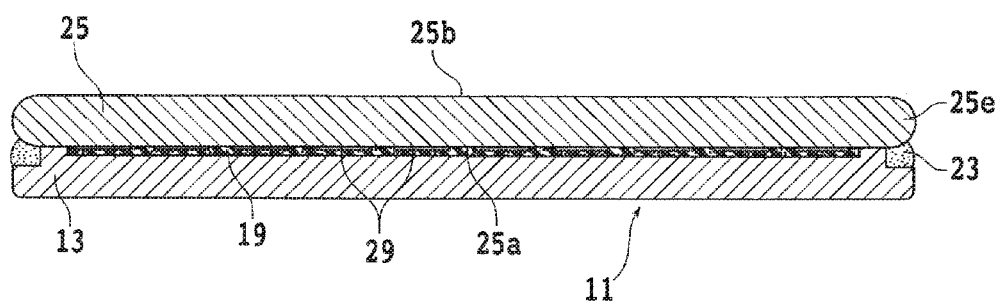
FIG. 7 is a sectional view showing a sticking step.

After the adhesive injecting step shown in FIG. 5 is carried out, as shown in FIG. 7, a sticking step of sticking the wafer 25 to the support plate 11 by the adhesive 23 disposed in the annular groove 17 of the support plate 11 in such a manner that the device region 31 of the wafer 25 abuts against the soft member 19 is carried out. The wafer 25 is stuck to the support plate 11 only at the peripheral part.

Figure 8:
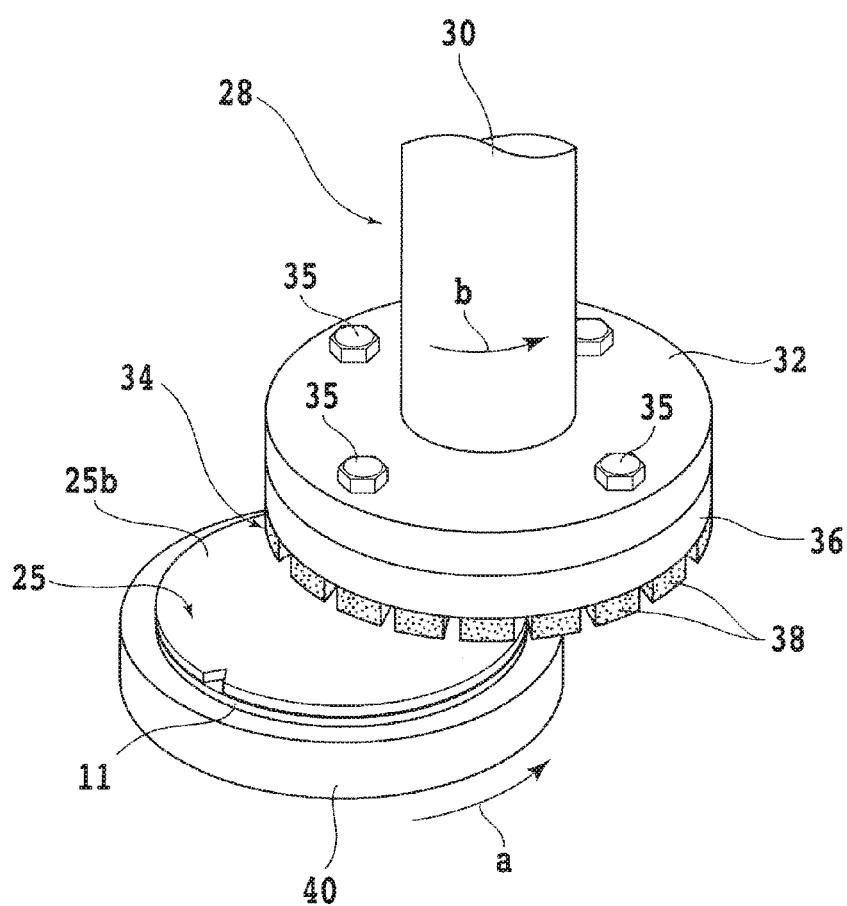
FIG. 8 is a perspective view showing a grinding step as one example of a processing step.

After the sticking step is carried out, a processing step of holding the wafer 25 with the intermediary of the support plate 11 and performing processing on the wafer 25 is carried out. The processing step includes a grinding step like one shown in FIG. 8. The grinding step will be described with reference to FIG. 8. In FIG. 8, a grinding unit 28 of grinding apparatus includes a spindle 30 that is rotationally driven, a wheel mount 32 fixed to the tip of the spindle 30, and a grinding wheel 34 attachably/detachably mounted on the wheel mount 32 by plural screws 35. The grinding wheel 34 is composed of an annular wheel base 36 and plural grinding abrasives 38 fixed to the peripheral part of the lower end of the wheel base 36 in an annular manner.

In the grinding step, the support plate 11 is held by suction by a chuck table 40 of the grinding apparatus and a back surface 25b of the wafer 25 is exposed. Then, the grinding wheel 34 is rotated in a direction indicated by an arrow b at e.g. 6000 rpm while the chuck table 40 is rotated in a direction indicated by an arrow a at e.g. 300 rpm. In addition, a grinding unit feed mechanism (not shown) is driven to bring the grinding abrasives 38 of the grinding wheel 34 into contact with the back surface 25b of the wafer 25. Then, grinding feed of the grinding wheel 34 is performed downward by a predetermined amount at a predetermined grinding feed rate. With measurement of the thickness of the wafer 25 by a thickness measurement gauge of a contact system or a contactless system, the wafer 25 is ground to a predetermined thickness, specifically e.g. 100 μm.

The processing step is not limited to the grinding step shown in FIG. 8, and also includes e.g. a laser processing step in which the support plate 11 is held by suction by a chuck table of laser processing apparatus and a modified layer is formed inside the wafer 25 by irradiating the wafer 25 with a laser beam having such a wavelength as to be transmissible through the wafer 25 from the side of the back surface 25b of the wafer 25, and so forth.

Figure 9A:
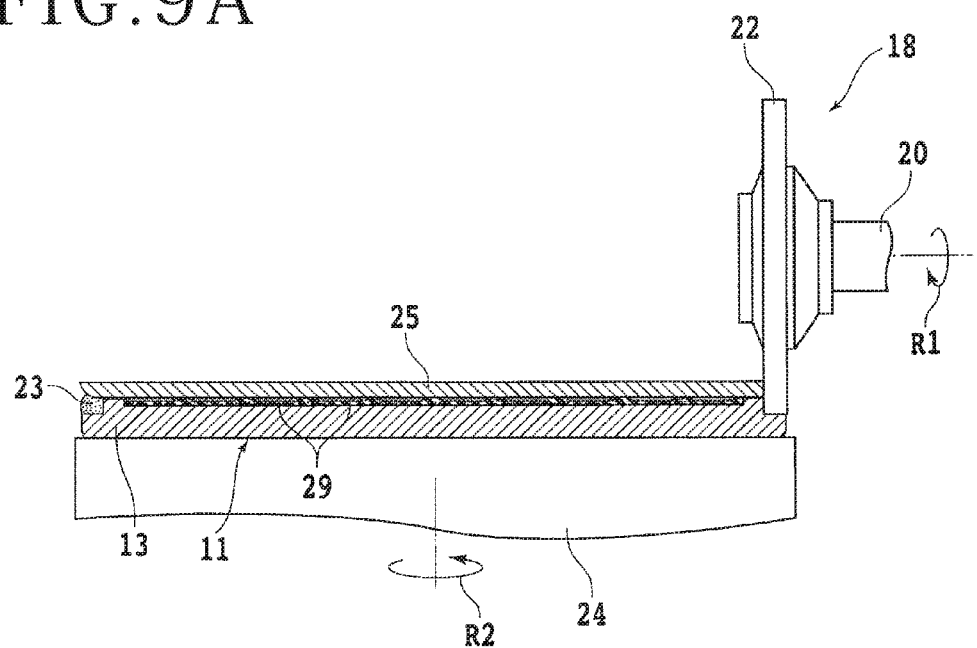
FIG. 9A is a partially sectional side view showing a first embodiment of an adhesive removing step.

After the grinding step shown in FIG. 8 is carried out, as shown in FIG. 9A, an adhesive removing step is carried out. In this step, the cutting blade 22 that rotates at a high speed in a direction of an arrow R1 is made to cut into the region corresponding to the annular groove 17 of the support plate 11 and the chuck table 24 is rotated at a low speed in a direction of an arrow R2 to remove the adhesive 23.

Figure 9B:
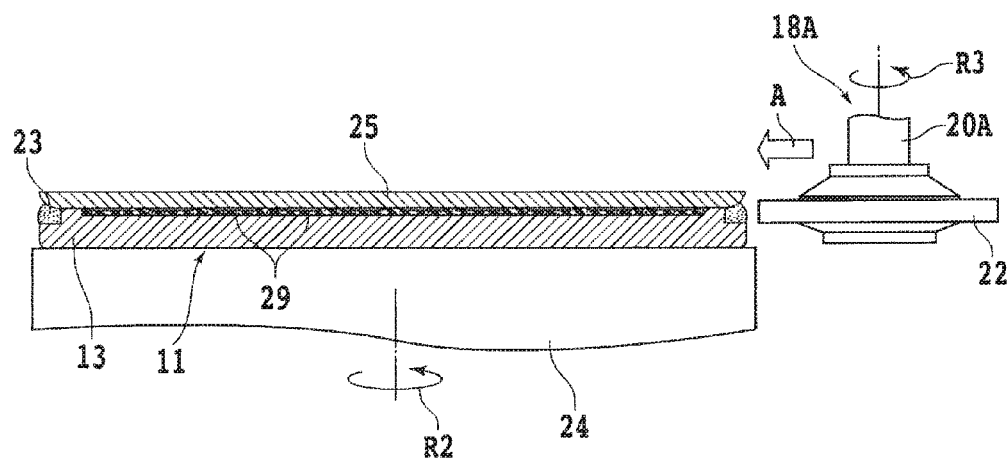
FIG. 9B is a partially sectional side view showing a second embodiment of the adhesive removing step.

This adhesive removing step may be carried out by using a cutting unit 18A like one shown in FIG. 9B. The cutting unit 18A includes a spindle 20A extending along the vertical direction and the cutting blade 22 mounted at the lower end part of the spindle 20A. In the adhesive removing step of the present embodiment, the cutting blade 22 that rotates at a high speed in a direction of an arrow R3 is moved in a direction of an arrow A and the cutting blade 22 is made to cut into the region corresponding to the annular groove 17 of the support plate 11 from the lateral side. Furthermore, the chuck table 24 is rotated at a low speed in a direction of an arrow R2 to remove the adhesive 23.

Figure 10:
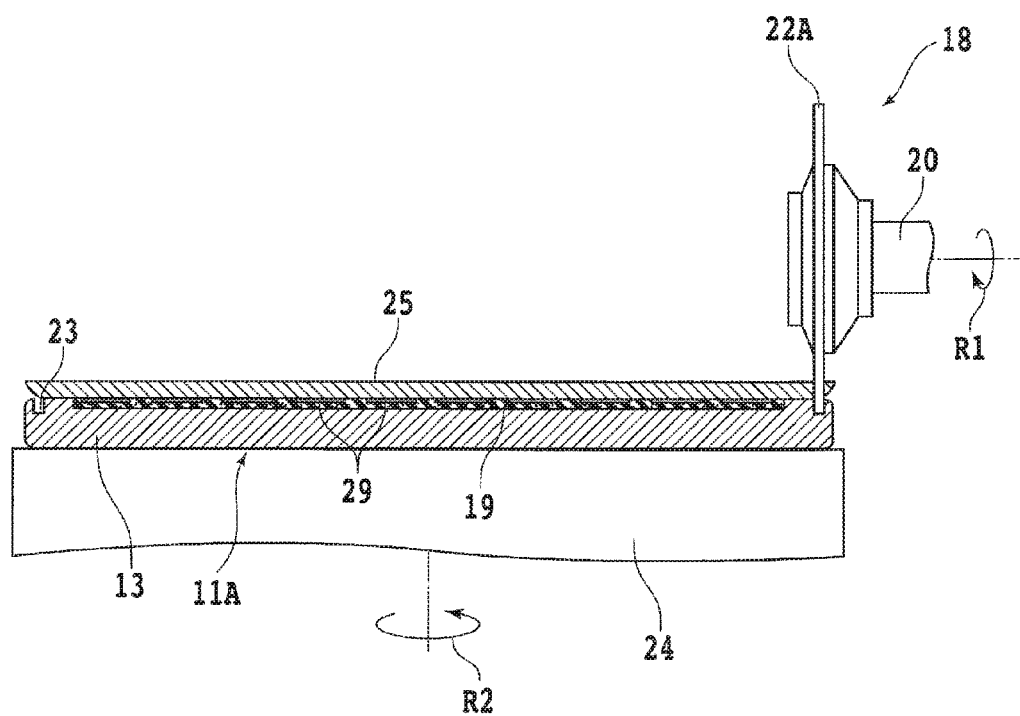
FIG. 10 is a partially sectional side view showing a third embodiment of the adhesive removing step.

FIG. 10 shows another embodiment of the adhesive removing step. In the present embodiment, the adhesive 23 injected into the annular groove 21 of the support plate 11A of the second embodiment shown in FIG. 1B is removed. Specifically, a cutting blade 22A having a small thickness is made to cut into the region corresponding to the annular groove 21 of the support plate 11A while being rotated at a high speed in a direction of an arrow R1 and the chuck table 24 is rotated at a low speed in a direction of an arrow R2 to remove the adhesive 23 in the annular groove 21.

In the embodiments shown in FIGS. 9A, 9B, and 10, the adhesive removing step is carried out by the cutting blade. However, the adhesive removing step is not limited thereto and the adhesive may be removed by utilizing a grinding wheel or a laser beam.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method for processing a wafer having a device region in which a plurality of devices are formed and a peripheral surplus region surrounding the device region on a front surface thereof, the method comprising:
   a support plate preparing step of preparing a support plate including a base plate in which a recess is formed in a front surface region corresponding to the device region of the wafer to be stuck to the support plate and an annular groove is formed in a region corresponding to the peripheral surplus region of the wafer and a soft member packed in the recess of the base plate;
   an adhesive injecting step of injecting an adhesive into the annular groove of the support plate;
   a sticking step of sticking the wafer onto the support plate with intermediary of the adhesive in such a manner that the device region of the wafer abuts against the soft member after carrying out the adhesive injecting step;

a processing step of holding the wafer with intermediary of the support plate and performing processing on the wafer after carrying out the sticking step; and an adhesive removing step of making a cutting blade cut into a region corresponding to the annular groove of the support plate and removing the adhesive after carrying out the processing step, wherein said adhesive removing step includes rotating the cutting blade about a blade spindle that extends in the vertical direction while rotating the wafer about a spindle that extends in the vertical direction.

2. The method according to claim 1, wherein:

the wafer includes the front surface and a back surface, and the devices are formed on the front surface of the wafer; and the sticking step comprises sticking the wafer to the support plate with the front surface facing the support plate, such that the adhesive contacts the peripheral surplus region of the support plate.

3. The method according to claim 1, further comprising a soft member planarizing step of cutting a front surface of the soft member to planarize the front surface of the soft member.

4. The method according to claim 1, wherein a front surface of the soft member is flush with an uppermost portion of a front surface of the support plate.

5. The method according to claim 1, wherein the processing step includes performing grinding to grind the wafer to a predetermined thickness.

6. The method according to claim 1, wherein the processing step includes performing laser processing by applying a laser beam to the wafer to form a modified layer within the wafer.

7. The method according to claim 1, wherein the soft member is configured and arranged to be in direct contact with the front surface of the wafer.

8. The method according to claim 1, wherein the sticking step results in the device region of the wafer being in direct contact with the soft member.

9. A method for processing a wafer having a device region in which a plurality of devices are formed and a peripheral surplus region surrounding the device region on a front surface thereof, the method comprising:

a support plate preparing step of preparing a support plate including a base plate in which a recess is formed in a front surface region corresponding to the device region of the wafer to be stuck to the support plate and an annular groove is formed in a region corresponding to the peripheral surplus region of the wafer and a soft member packed in the recess of the base plate;

an adhesive injecting step of injecting an adhesive into the annular groove of the support plate;

a sticking step of sticking the wafer onto the support plate with intermediary of the adhesive in such a manner that the device region of the wafer abuts against the soft member after carrying out the adhesive injecting step;

a processing step of holding the wafer with intermediary of the support plate and performing processing on the wafer after carrying out the sticking step; and an adhesive removing step of making a cutting blade cut into a region corresponding to the annular groove of the support plate and removing the adhesive after carrying out the processing step, wherein said adhesive removing step comprises: rotating the cutting blade about a blade spindle that extends in the horizontal direction while rotating the wafer about a spindle that extends in the vertical direction, wherein the cutting blade has a small thickness such that it only cuts into a region corresponding to the annular groove, without cutting into outer peripheral edges of either the wafer or the support plate.

10. The method according to claim 9, wherein:

the wafer includes the front surface and a back surface, and the devices are formed on the front surface of the wafer; and the sticking step comprises sticking the wafer to the support plate with the front surface facing the support plate, such that the adhesive contacts the peripheral surplus region of the support plate.

11. The method according to claim 9, further comprising a soft member planarizing step of cutting a front surface of the soft member to planarize the front surface of the soft member.

12. The method according to claim 9, wherein a front surface of the soft member is flush with an uppermost portion of a front surface of the support plate.

13. The method according to claim 9, wherein the processing step includes performing grinding to grind the wafer to a predetermined thickness.

14. The method according to claim 9, wherein the processing step includes performing laser processing by applying a laser beam to the wafer to form a modified layer within the wafer.

15. The method according to claim 9, wherein the soft member is configured and arranged to be in direct contact with the front surface of the wafer.

16. The method according to claim 9, wherein the sticking step results in the device region of the wafer being in direct contact with the soft member.

* * * * *